(12) United States Patent
Foote (10) Patent No.: US 7,166,518 B1
(45) Date of Patent: Jan. 23, 2007

(54) SYSTEM AND METHOD FOR PROVIDING A SELF HEATING ADJUSTABLE TISI$_2$ RESISTOR

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 152 days.

(21) Appl. No.: 10/801,268

(22) Filed: Mar. 16, 2004

(51) Int. Cl.
*H01L 21/20* (2006.01)

(52) U.S. Cl. ............... 438/384; 438/382; 257/E21.006

(58) Field of Classification Search ........... 438/381, 438/382, 384, 385, 3; 257/536, 537, E21.004, 257/E21.006, 21.438
See application file for complete search history.

(56) References Cited

U.S. PATENT DOCUMENTS 5,831,276 A * 11/1998 Gonzalez et al. ............ 257/3
6,281,101 B1 * 8/2001 Iyer ........................ 438/587

* cited by examiner

*Primary Examiner*—Bradley K. Smith

(57) ABSTRACT

A system and method is disclosed for providing a self heating adjustable titanium disilicon (TiSi$_2$) resistor. A triangularly shaped layer of polysilicon is placed a layer of insulation material. A layer of titanium is applied over the polysilicon and heated to form a layer of C49 type of TiSi$_2$. A current is then applied to the small end of the triangularly shaped layer of C49 TiSi$_2$. The current generates heat in a high resistance portion of the triangularly shaped layer of C49 TiSi$_2$ and converts a portion of the C49 TiSi$_2$ to C54 TiSi$_2$. The lower resistance of the C54 TiSi$_2$ decreases the effective resistance of the resistor. A desired value of resistance may be selected by adjusting the magnitude of the applied current.

19 Claims, 5 Drawing Sheets

SYSTEM AND METHOD FOR PROVIDING A SELF HEATING ADJUSTABLE TISI$_2$ RESISTOR

TECHNICAL FIELD OF THE INVENTION

The present invention is generally directed to manufacturing technology for semiconductor devices and, in particular, to a system and method for providing a self heating adjustable titanium disilicon (TiSi$_2$) resistor.

BACKGROUND OF THE INVENTION

Prior art resistors for semiconductor devices are typically constructed so that the resistance of a resistor is a fixed value. The fixed value of resistance is dependent upon the circuit parameters selected to manufacture the resistor.

There are some circuit applications in which it would be desirable to have a resistor that could have the value of the resistance adjusted after the wafer fabrication is complete and the device is packaged. Prior art resistors for semiconductor devices are not generally designed to provide an adjustable value of resistance.

Therefore, there is a need in the art for a system and method for providing a resistor that is capable of having the resistance value adjusted after packaging. That is, there is a need in the art for a system and method for providing a resistor that is capable of having one of a plurality of possible resistances.

SUMMARY OF THE INVENTION

To address the above-discussed deficiencies of the prior art, it is a primary object of the present invention to provide a system and method for providing a resistor that is capable of having the resistance adjusted after the unit is packaged.

In one advantageous embodiment of the present invention an adjustable titanium disilicon (TiSi$_2$) resistor is constructed in the following manner. A triangularly shaped layer of polysilicon is placed on an insulated layer such as silicon dioxide mounted on a handle wafer. Then a layer of titanium is applied over the triangularly shaped layer of polysilicon. Then the layer of titanium is heated to a temperature of approximately six hundred twenty degrees Centigrade (620° C.) to form a triangularly shaped layer of C49 type titanium disilicon (TiSi$_2$) in the polysilicon layer. The unconverted titanium is then removed.

Then a dielectric layer is placed over the triangularly shaped TiSi$_2$ layer. A mask and etch procedure is performed to etch the dielectric layer to form a contact receptacle trench for receiving an input contact at the small end of the triangularly shaped TiSi$_2$ layer and a contact receptacle trench for receiving an output contact at the large end of the triangularly shaped TiSi$_2$ layer. A metal deposition procedure and a metal etch procedure are performed to form the input contact and the output contact. An additional mask and metal deposition procedure is performed to form an input metal connector for the input contact and an output metal connector for the output contact.

A current is provided to the triangularly shaped TiSi$_2$ layer through the input contact that is coupled to the small end of the triangularly shaped TiSi$_2$ layer. The current self heats the narrowest part of the C49 TiSi$_2$ resistor due to the high power density portion of the triangularly shaped TiSi$_2$ layer and converts a portion of the C49 type TiSi$_2$ to C54 type TiSi$_2$. The C54 type TiSi$_2$ has a lower resistance than the C49 type TiSi$_2$. The lower resistance of the C54 type TiSi$_2$ decreases the effective resistance of this portion of the triangularly shaped TiSi$_2$ layer and decreases the power density, allowing the converted area to cool. Now the total resistance of the triangularly shaped resistor has been permanently decreased due to the change bulk resistivity of the small area converted to C54 type TiSi$_2$.

As the magnitude of the current is increased the power density in the next narrowest part of the triangle will reach a point where self heating converts more of the C49 type TiSi$_2$ to the C54 type TiSi$_2$ thereby further reducing the effective resistance of the resistor and dropping the power density and allowing the section to cool as before.

A desired value of resistance for the adjustable resistor may be selected by setting the magnitude of the current to a value that produces a desired value of resistance up to the point where the entire triangle has been converted to C54 type TiSi$_2$ and so reaches the lowest value of resistance. It is necessary that the resistance of the narrowest part of the triangle, when converted to C54 type TiSi$_2$, have a lower resistance than the widest part of the triangle while it is C49 type TiSi$_2$. Because the difference in bulk resistivity is about 14.5 micro-ohm-cm to 70.0 micro-ohm-cm, a difference in width of about four (4) to one (1) is appropriate.

It is an object of the present invention to provide a system and method for providing a resistor that is capable of having more than one value of resistance.

It is also an object of the present invention to provide a system and method for providing a self heating adjustable TiSi$_2$ resistor.

It is yet another object of the present invention to provide a system and method for providing an adjustable resistor in which a desired value of resistance may be selected by setting a magnitude of a current to a value that produces a desired value of resistance.

It is still another object of the present invention to provide a system and method for providing a self heating adjustable TiSi$_2$ resistor in which a current is capable of generating heat in an area of high power density and converting a portion of C49 type TiSi$_2$ to C54 type TiSi$_2$ to decrease the effective resistance of the resistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 15, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged resistor.

Figure 1:
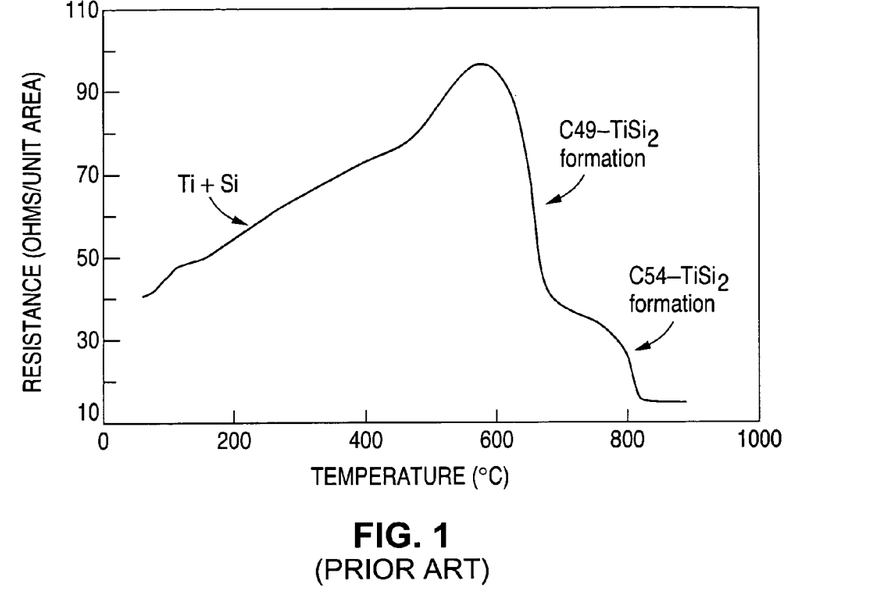
FIG. 1 illustrates a prior art graph of resistance versus temperature showing the resistance of a combination of titanium (Ti) and silicon (Si) as a function of temperature.

FIG. 1 illustrates a prior art graph of resistance versus silicidation temperature showing the resistance of a titanium (Ti) and silicon (Si) combination as a function of silicidation temperature. The measure of resistance is ohms per unit area. The resistance scale runs from ten (10) ohms per unit area to one hundred ten (110) ohms per unit area. The measure of temperature is degrees Centigrade. The temperature scale runs from zero degrees Centigrade (0° C.) to one thousand degrees Centigrade (1000° C.).

At the lower temperatures the resistance of the combination of the titanium (Ti) and the silicon (Si) increases approximately linearly with increasing temperature. The maximum resistance of approximately ninety six (96) ohms per unit area is reached when the temperature is approximately six hundred degrees Centigrade (600° C.). In the temperature range of approximately six hundred degrees Centigrade (600° C.) to six hundred fifty degrees Centigrade (650° C.) the titanium and the silicon form the C49 type of titanium disilicon (TiSi$_2$). As shown in FIG. 1, the resistance of the C49 type TiSi$_2$ continues to drop as the temperature increases.

When the temperature increases above approximately seven hundred degrees Centigrade (700° C.) the titanium and the silicon form the C54 type of titanium disilicon (TiSi$_2$). As also shown in FIG. 1, the resistance of the C54 type TiSi$_2$ continues to drop as the temperature increases. Therefore the resistance of the C54 type TiSi$_2$ is lower than the resistance of the C49 type TiSi$_2$. The resistor of the present invention makes use of the thermal properties of TiSi$_2$ to adjust the value of resistance in the resistor.

Figure 2:
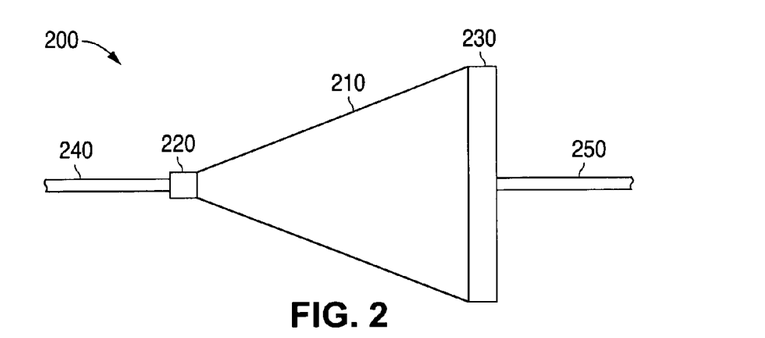
FIG. 2 illustrates a top plan view of an advantageous embodiment of a triangularly shaped self heating adjustable TiSi$_2$ resistor of the present invention.

FIG. 2 illustrates a top plan view of an advantageous embodiment of a triangularly shaped self heating adjustable TiSi$_2$ resistor 200 of the present invention. Resistor 200 comprises a resistor layer 210 that is formed having a triangular shape. As will be more fully described, resistor layer 210 comprises a layer of polysilicon over which a titanium layer has been applied. The titanium layer is heated to a temperature of approximately six hundred twenty degrees Centigrade (620° C.) to form C49 type TiSi$_2$ in resistor layer 210.

The small end of the triangle of resistor layer 210 is electrically coupled to input contact 220. The large end of the triangle of resistor layer 210 is electrically coupled to output contact 230. An input metal connector 240 is electrically coupled to input contact 220 and an output metal connector 250 is electrically coupled to output contact 230. Current from metal connector 240 is supplied to resistor layer 210 through input contact 220. The current then flows through resistor layer 210 to output contact 230. The current exits output contact 230 through output metal connector 250.

Figure 3:
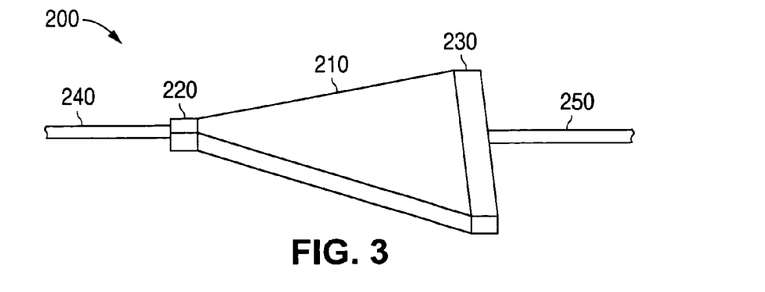
FIG. 3 illustrates a perspective side view of the resistor shown in FIG. 2.

FIG. 3 illustrates a perspective side view of the resistor 200 shown in FIG. 2. The resistor layer 210, input contact 220, output contact 230, input metal connector 240, and output metal connector 250 are all mounted on an underlying insulating layer such as silicon dioxide (not shown in FIG. 3).

FIGS. 4 through 11 illustrate successive stages in the construction of an advantageous embodiment of a self heating adjustable TiSi$_2$ resistor 200 in accordance with the principles of the present invention. To simplify the drawings the reference numerals from previous drawings will sometimes not be repeated for structures that have already been identified.

Figure 4:
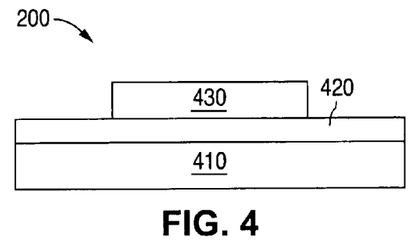
FIGS. 4 through 11 illustrate successive stages in the construction of an advantageous embodiment of a self heating adjustable TiSi$_2$ resistor in accordance with the principles of the present invention.

First, an insulating layer such as silicon dioxide 420 is mounted on a handle wafer 410. Then a triangularly shaped polysilicon layer 430 is placed on the insulating layer 420. The result of these steps is shown in FIG. 4.

Figure 5:
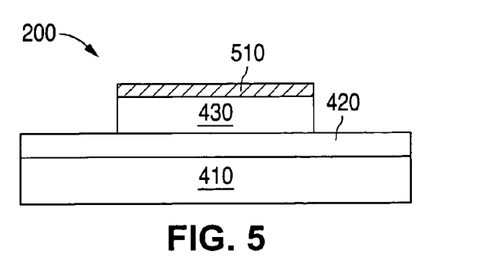

Then a layer of titanium is applied over the triangularly shaped layer of polysilicon 430. In one advantageous embodiment the thickness of the titanium layer is approximately five hundred Ångstroms (500 Å). The titanium layer is then heated to a temperature of approximately six hundred twenty degrees Centigrade (620° C.) to form C49 type TiSi$_2$ in polysilicon layer 430. After the heating process is completed, any remaining unconverted titanium is then stripped away from polysilicon layer 430 leaving only C49 type TiSi2 in TiSi$_2$ layer 510. The result of these procedures is shown in FIG. 5.

Figure 6:
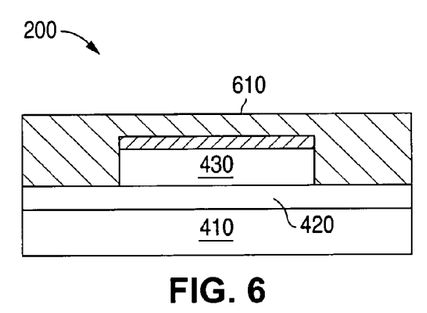
Figure 7:
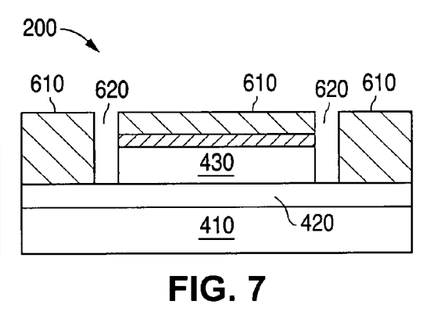

A dielectric layer 610 is then deposited over the TiSi2 layer 510 and portions of the silicon dioxide layer 420. The result of the dielectric deposition step is shown in FIG. 6. A mask and etch procedure is then performed on dielectric layer 610 to etch contact receptacle trenches 620 in dielectric layer 610. The result of the mask and etch procedure is shown in FIG. 7.

Figure 8:
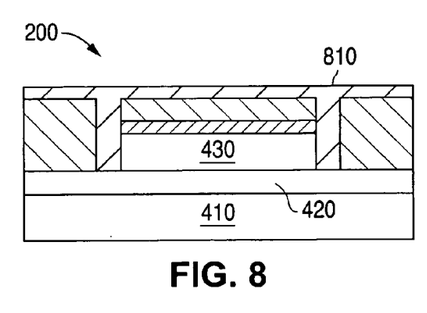
Figure 9:
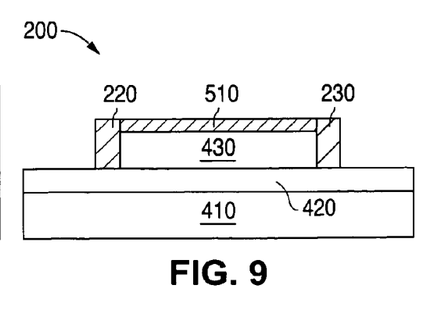

Then a metal deposition procedure is employed to deposit metal 810 into the contact receptacle trenches 620 to form input contact 220 and output contact 230. The result of the metal deposition procedure is shown in FIG. 8. Then a metal etch procedure is performed to etch away excess metal 810 and the remaining portions of dielectric layer 610. The result of the etch procedure is shown in FIG. 9.

Figure 10:
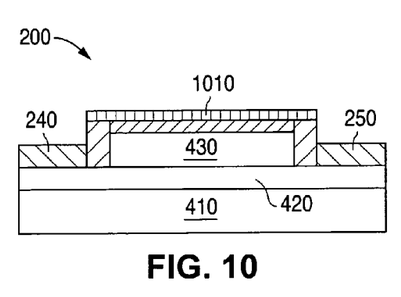
Figure 11:
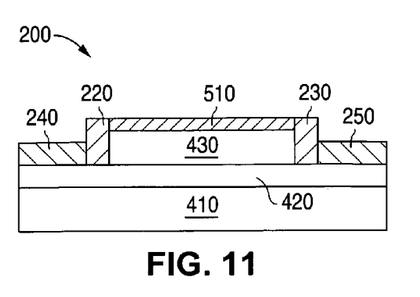

Then a mask 1010 is placed over the $TiSi_2$ layer 510 and the input contact 220 and the output contact 230. A metal deposition procedure is then performed to form the input metal connector 240 and the output metal connector 250. The result of these steps is shown in FIG. 10. Then the mask 1010 is stripped away and resistor 200 has the structure shown in FIG. 11.

Figure 12:
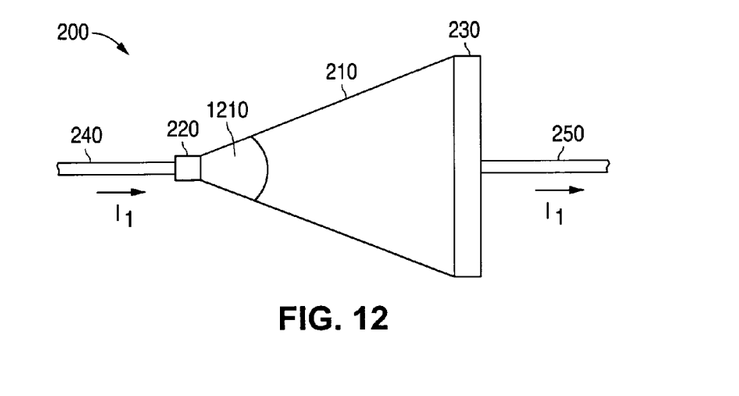
FIG. 12 illustrates the operation of an advantageous embodiment of a self heating adjustable TiSi$_2$ resistor of the present invention at a first value of current I$_1$.

FIG. 12 illustrates the operation of an advantageous embodiment of a self heating adjustable $TiSi_2$ resistor 200 of the present invention at a first value of current $I_1$. The current $I_1$ passes through input metal connector 240 to input contact 220 and then into resistor layer 210. Resistor layer 210 comprises $TiSi_2$ layer 510 and polysilicon layer 430. The current $I_1$ passes out of resistor layer 210 through output contact 230 and output metal connector 250.

The narrow end of resistor layer 210 will have a higher power density than the wide end of resistor layer 210. That is, the portions of resistor layer 210 that are nearest to input contact 220 will experience a higher power density than those portions of resistor layer 210 that are farther from input contact 220.

The portion 1210 of resistor layer 210 in FIG. 12 represents an area of high power density for current $I_1$. The high power density in portion 1210 generates heat. When the temperature in portion 1210 exceeds approximately seven hundred degrees Centigrade (700° C.), then the C49 type $TiSi_2$ within portion 1210 is converted to C54 type $TiSi_2$. Because the resistance of C54 type $TiSi_2$ is less than the resistance of C49 type $TiSi_2$ the resulting effective resistance of resistor layer 210 decreases after the C49 type $TiSi_2$ within portion 1210 has been converted to C54 type $TiSi_2$. The conversion of the C49 type $TiSi_2$ to the C54 type $TiSi_2$ is initiated by the "self heating" that is created by the high power density within portion 1210 of resistor layer 210.

After the portion 1210 has been converted to C54 type $TiSi_2$ the resistance of resistor layer 210 drops so that, for a given value of current $I_1$, no more of the C49 type $TiSi_2$ will be converted. This means that the reaction is self limiting.

Figure 13:
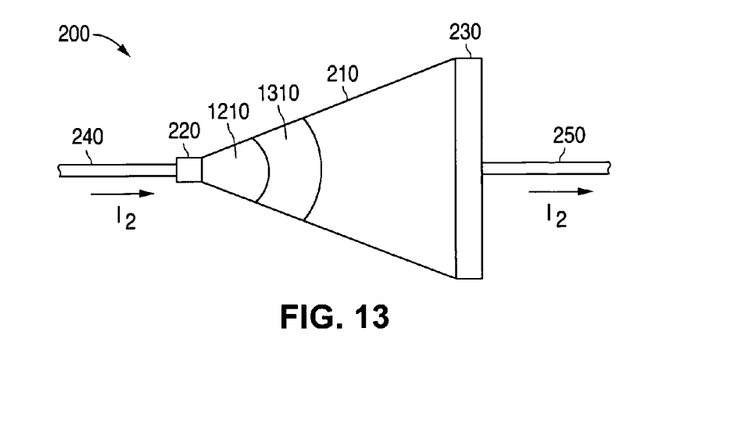
FIG. 13 illustrates the operation of an advantageous embodiment a self heating adjustable TiSi$_2$ resistor of the present invention at a second value of current I$_2$.

FIG. 13 illustrates the operation of an advantageous embodiment a self heating adjustable $TiSi_2$ resistor 200 of the present invention at a second value of current $I_2$. As in the case for the first value of current $I_1$ shown in FIG. 12, the current $I_2$ in FIG. 13 passes through input metal connector 240 to input contact 220 and then into resistor layer 210. Resistor layer 210 comprises $TiSi_2$ layer 510 and polysilicon layer 430. The current $I_2$ passes out of resistor layer 210 through output contact 230 and output metal connector 250.

Also as in the case for the current $I_1$, the narrow end of resistor layer 210 will have a higher power density than the wide end of resistor layer 210. That is, the portions of resistor layer 210 that are nearest to input contact 220 will experience a higher power density than those portions of resistor layer 210 that are farther from input contact 220.

The portion 1310 of resistor layer 210 in FIG. 13 represents an area of high power density for current $I_2$. Because the current $I_2$ is greater in magnitude than the current $I_1$, the area of portion 1310 is greater than the area of portion 1210. As in the case of portion 1210, the high power density in portion 1310 generates heat. When the temperature in portion 1310 exceeds approximately seven hundred degrees Centigrade (700° C.), then the C49 type $TiSi_2$ within portion 1310 is converted to C54 type $TiSi_2$. Because the resistance of C54 type $TiSi_2$ is less than the resistance of C49 type $TiSi_2$ the resulting effective resistance of resistor layer 210 decreases after the C49 type $TiSi_2$ within portion 1310 has been converted to C54 type $TiSi_2$. The conversion of the C49 type $TiSi_2$ to the C54 type $TiSi_2$ is initiated by the "self heating" that is created by the high power density within portion 1310 of resistor layer 210.

After the portion 1310 has been converted to C54 type $TiSi_2$ the resistance of resistor layer 210 drops further so that, for a given value of current $I_2$, no more of the C49 type $TiSi_2$ will be converted. As in the case of current $I_1$, the reaction for current $I_2$ is self limiting.

As the current through resistor layer 210 increases (e.g., from current $I_1$ to current $I_2$), the area of high power density increases and more C49 type $TiSi_2$ is converted to C54 type $TiSi_2$. This means that the effective resistance of resistor layer 210 decreases with increasing current through resistor layer 210.

This means that it is possible to adjust the effective value of resistance of resistor layer 210 by selecting the magnitude of the current through resistor layer 210. That is, by selecting a first amount of current it is possible to produce a first value of resistance in resistor layer 210. By selecting a second larger amount of current it is possible to produce a second smaller value of resistance in resistor layer 210. The magnitude of the current through resistor layer 210 is selected to produce a desired value of resistance.

The current that is applied may pass through the resistor layer 210 in either direction. That is, the current may be passed through the triangularly shaped resistor layer 210 from either the narrow end or the wide end. It is the width of the triangularly shaped resistor layer 210 (and not the direction of current flow) that determines which end will be converted first.

Figure 14:
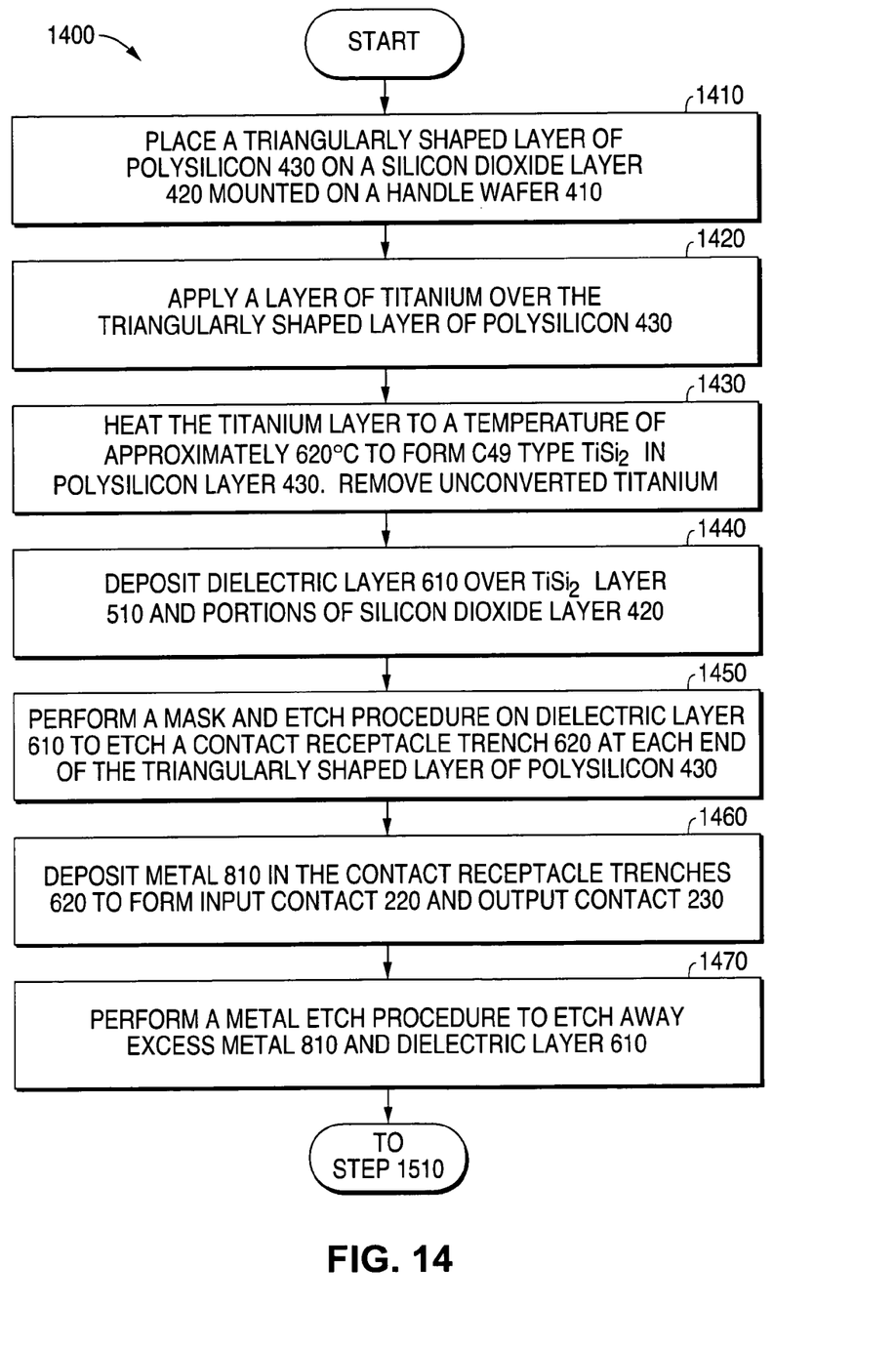
FIG. 14 illustrates a flow chart showing the steps of a first portion of an advantageous embodiment of the method of the present invention.

FIG. 14 illustrates a flow chart 1400 showing the steps of a first portion of an advantageous embodiment of the method of the present invention. The manufacture of resistor 200 of the present invention begins by providing a handle wafer 410. A silicon dioxide layer 420 is then mounted on the handle wafer 410. A triangularly shaped layer of polysilicon 430 is then placed on the silicon dioxide layer 420 (step 1410). Then a layer of titanium is applied over the triangularly shaped layer of polysilicon 430 (step 1420).

Then a heat treatment is applied to heat the titanium layer to a temperature of approximately six hundred twenty degrees Centigrade (620° C.) to form C49 type $TiSi_2$ in polysilicon layer 430. The unconverted titanium is then removed (step 1430). Then a dielectric layer 610 is deposited over the $TiSi_2$ layer 510 and portions of the silicon dioxide layer 420 (step 1440). Then a mask and etch procedure is performed on dielectric layer 610 to etch a contact receptacle trench 620 at each end of the triangularly shaped layer of polysilicon 430 (step 1450).

Then a metal deposition procedure is performed to deposit metal 810 in the contact receptacle trenches 620 to form input contact 220 and output contact 230 (step 1460). A metal etch procedure is then performed to etch away excess metal 810 and dielectric layer 610 (step 1470). Control then passes to step 1510 of FIG. 15.

Figure 15:
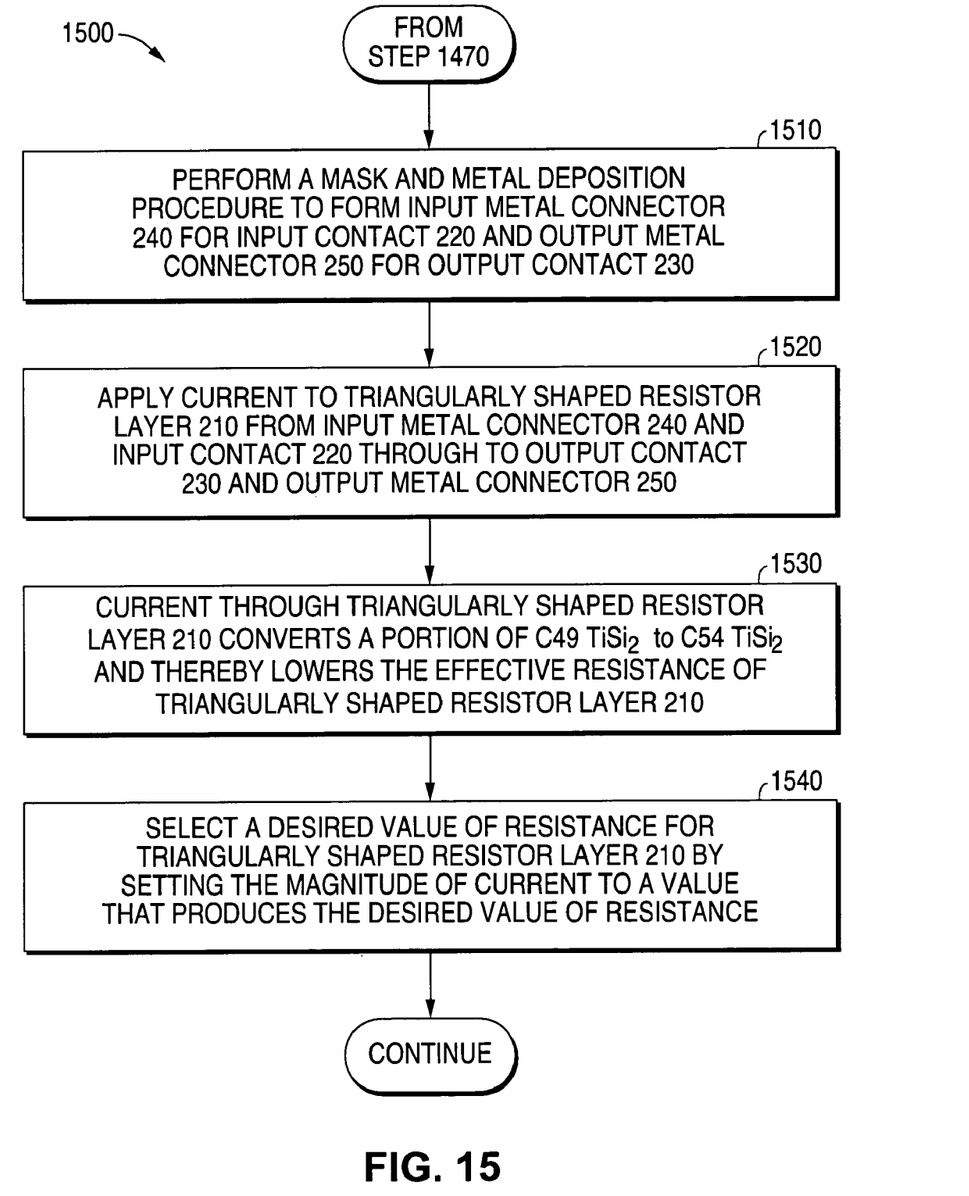
FIG. 15 illustrates a flow chart showing the steps of a second portion of an advantageous embodiment of the method of the present invention.

FIG. 15 illustrates a flow chart 1500 showing the steps of a second portion of an advantageous embodiment of the method of the present invention. Control passes to step 1510 from step 1470 of FIG. 14. A mask and metal deposition procedure is then performed to form input metal connector 240 for input contact 220 and output metal connector 250 for output contact 230 (step 1510). These steps form the self heating adjustable $TiSi_2$ resistor 200 of the present invention.

A current is then applied to the triangularly shaped resistor layer 210 of resistor 200. The current enters resistor layer 210 from input metal connector 240 and input contact 220. The current leaves resistor layer 210 through output contact 230 and output metal connector 250 (step 1520).

The current that passes through resistor layer 210 heats a high resistance portion of resistor layer 210 and converts a portion of the C49 type $TiSi_2$ to C54 type $TiSi_2$. The lower resistance of the C54 type $TiSi_2$ decreases the effective resistance of the triangularly shaped resistor layer 210 (step 1530). A desired value of resistance for the triangularly shaped resistor layer 210 may be selected by setting the magnitude of the current to a value that produces a desired value of resistance.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for providing a self heating adjustable titanium disilicon ($TiSi_2$) resistor, said method comprising the steps of:
   placing a triangularly shaped layer of polysilicon on a layer of insulation material;
   applying a layer of titanium over said triangularly shaped layer of polysilicon;
   heating said layer of titanium to form a triangularly shaped layer of C49 type titanium disilicon ($TiSi_2$) in said triangularly shaped layer of polysilicon;
   coupling a small end of said triangularly shaped layer of polysilicon to an input contact; and
   coupling a large end of said triangularly shaped layer of polysilicon to an output contact.

2. The method as set forth in claim 1 further comprising the steps of:
   coupling an input metal connector to said input contact; and
   coupling an output metal connector to said output contact.

3. The method as set forth in claim 1 wherein a thickness of said layer of titanium is approximately five hundred Ångstroms (500 Å).

4. The method as set forth in claim 1 wherein said step of heating said layer of titanium to form a layer of C49 type titanium disilicon ($TiSi_2$) in said triangularly shaped layer of polysilicon comprises the step of:
   heating said layer of titanium to a temperature of approximately six hundred twenty degrees Centigrade.

5. The method as set forth in claim 1 further comprising the step of:
   removing unconverted titanium from said layer of C49 type $TiSi_2$ in said triangularly shaped layer of polysilicon.

6. A method for providing a self heating adjustable titanium disilicon ($TiSi_2$) resistor, said method comprising the steps of:
   placing a triangularly shaped layer of polysilicon on a layer of insulation material;
   applying a layer of titanium over said triangularly shaped layer of polysilicon;
   heating said layer of titanium to form a triangularly shaped layer of C49 type $TiSi_2$ in said triangularly shaped layer of polysilicon;
   applying a current to said triangularly shaped layer of C49 type $TiSi_2$ in said triangularly shaped layer of polysilicon; and
   converting a portion of said triangularly shaped layer of C49 type $TiSi_2$ to C54 type $TiSi_2$ to lower a resistance of said triangularly shaped layer of C49 type $TiSi_2$.

7. The method as set forth in claim 6 wherein said step of converting a portion of said triangularly shaped layer of C49 type $TiSi_2$ to C54 type $TiSi_2$ comprises the steps of:
   generating heat from said current in a high resistance portion of said triangularly shaped layer of C49 type $TiSi_2$; and
   increasing a temperature of said high resistance portion of said triangularly shaped layer of C49 type $TiSi_2$ to a temperature that is at least approximately seven hundred degrees Centigrade.

8. The method as set forth in claim 7 wherein said conversion of C49 type $TiSi_2$ to C54 type $TiSi_2$ in said high resistance portion decreases a resistance of said high resistance portion to a level of resistance where no more C49 type $TiSi_2$ is converted for said value of current.

9. The method as set forth in claim 7 further comprising the step of:
   selecting a desired value of resistance for said triangularly shaped layer of C49 type $TiSi_2$ by selecting a magnitude of said current.

10. The method as set forth in claim 7 further comprising the step of:
    decreasing a resistance of said triangularly shaped layer of C49 type $TiSi_2$ by increasing a magnitude of said current.

11. A method, comprising:
    forming a triangularly shaped resistor layer comprising C49 type titanium disilicon ($TiSi_2$);
    heating the resistor layer to alter a resistance of the resistor layer;
    coupling a smaller end of the resistor layer to a first contact; and
    coupling a larger end of the resistor layer to a second contact.

12. The method of claim 11, further comprising:
    coupling a first metal connector to the first contact; and
    coupling a second metal connector to the second contact.

13. The method of claim 11, wherein forming the resistor layer comprises:
    depositing titanium on a triangularly shaped polysilicon layer; and
    heating the titanium to form the C49 type $TiSi_2$.

14. The method of claim 13, wherein heating the titanium comprises:
    heating the titanium to a temperature of approximately six hundred twenty degrees Centigrade.

15. The method of claim 13, wherein the titanium has a thickness of approximately five hundred Ångstroms (500 Å).

16. A method, comprising:
    forming a triangularly shaped resistor layer comprising C49 type titanium disilicon ($TiSi_2$); and heating the resistor layer to alter a resistance of the resistor layer, wherein heating the resistor layer comprises applying a current to the resistor layer to convert a portion of the C49 type $TiSi_2$ to C54 type $TiSi_2$.

17. The method of claim 16, wherein converting the portion of the C49 type $TiSi_2$ to C54 type $TiSi_2$ comprises: increasing a temperature of a high resistance portion of the C49 type $TiSi_2$ to a temperature that is at least approximately seven hundred degrees Centigrade.

18. The method of claim 16, further comprising:

selecting a magnitude of the current to provide a desired resistance for the resistor layer.

19. The method of claim 16, further comprising:

decreasing the resistance of the resistor layer by increasing a magnitude of the current.

* * * * *